United States Patent [19]

Berman

[11] Patent Number: 5,852,317

[45] Date of Patent: Dec. 22, 1998

[54] METHOD TO REDUCE GATE OXIDE DAMAGE DUE TO NON-UNIFORM PLASMAS IN READ ONLY MEMORY ARRAYS

[75] Inventor: Rina Berman, Herzlia, Israel

[73] Assignee: National Semiconductor Corporation, Santa Clara, Calif.

[21] Appl. No.: 788,360

[22] Filed: Jan. 24, 1997

Related U.S. Application Data

[63] Continuation of Ser. No. 414,916, Mar. 31, 1995, abandoned.

[51] Int. Cl.$^6$ ................................. H01L 27/112
[52] U.S. Cl. ........................... 257/390; 257/360
[58] Field of Search ...................... 257/390, 360

[56] References Cited

U.S. PATENT DOCUMENTS

| | | | |
|---|---|---|---|
| 5,111,262 | 5/1992 | Chen et al. | 257/360 |
| 5,430,602 | 7/1995 | Chin et al. | 257/360 |
| 5,486,716 | 1/1996 | Saito et al. | 257/360 |

*Primary Examiner*—Jerome Jackson, Jr.
*Attorney, Agent, or Firm*—Limbach & Limbach L.L.P.

[57] ABSTRACT

A common problem in the manufacture of MOS ROM devices is the "antenna effect", whereby charges accumulate on long conductors (especially gate poly) during certain processing steps, particularly plasma processing. These charges can cause gate voltage sufficient to punch-through or break down thin gate oxide regions. By adding a "load" transistor to each length of conductor (e.g., by bank or row), and adjusting the size of the load transistor to cause total capacitance on the conductor to reach a minimum value, the antenna effect is minimized and process yield is improved. The size of the load transistor is determined based upon the amount of program-dependent capacitive load placed on each conductor (i.e., the number of transistor gates connected to the conductor). One aspect of the invention provides for omitting the load transistor if there is no load on a conductor (i.e., no transistor gates connected), since in this case, there is essentially no likelihood of antenna-effect-induced damage to the transistor gates.

29 Claims, 4 Drawing Sheets

PRIOR ART

METHOD TO REDUCE GATE OXIDE DAMAGE DUE TO NON-UNIFORM PLASMAS IN READ ONLY MEMORY ARRAYS

This is a continuation of application Ser. No. 08/414,916 filed on Mar. 31, 1995, now abandoned.

TECHNICAL FIELD OF THE INVENTION

The invention relates to the fabrication and processing of semiconductor devices and, more particularly, to the fabrication and processing of MOS (Metal-Oxide-Silicon) memory devices, and specifically to read-only memory (ROM) devices.

BACKGROUND OF THE INVENTION

In semiconductor memory devices, particularly MOS ROM devices, there are often relatively long conductor runs connected to one or more MOS transistor gate terminals. As is well known to those of ordinary skill in the art, transistor gates are constructed such that a conductive gate terminal material is formed over a thin gate oxide region which, in turn, overlies a channel material between a source and a drain terminal of the transistor. Typically, transistors in a MOS memory device (e.g, ROM) are laid out in "banks", or long parallel rows of transistors, and the gate terminal material is a polysilicon line (commonly referred to as "gate poly") which interconnects all of the transistor gates in a bank of transistors. (A typical CMOS process would have at least two additional overlying conductive metal "wiring" layers insulated from one another by oxide layers, commonly referred to as "Metal 1" and "Metal 2" layers.) In such ROM devices, the gates of the transistors behave as capacitors, with the gate terminal acting as one capacitor 'plate', the channel material acting as another capacitor 'plate', and the thin gate oxide region separating the gate terminal material from the channel material forming a dielectric layer between the two capacitor plates. In a bank of transistors, the capacitances of these gates would be additive. Accordingly, the total capacitance on any such long conductor run is directly proportional to the number of gate terminals connected to it.

Typically, the thin gate oxide region is thin enough that its dielectric strength is not very great. A relatively small voltage across the thin gate oxide region can result in electrical breakdown of the gate oxide, resulting in consequent permanent damage to (e.g., destruction of) the transistor. As a result, it is essential that processing of such MOS transistors be accomplished in a manner which does not produce excessive voltages across gate capacitances.

A "program" or bit pattern in a ROM memory device is typically implemented by customizing one or more of the later fabrication process steps to selectively form and/or omit transistors or connections to transistors in an array pattern. (Typically, the selectively formed/omitted structures operate by affecting either a connection to a transistor or by affecting a structure which permits the transistor to function.) Hereinafter, such selective formation of or connection to transistors will be referred to as "selectively enabling" the transistors. Enabled transistors can be considered to be logic ONEs, and those which are not enabled can be considered to be logic ZEROs. The gate terminals of groups (banks) of these transistors are connected in common to addressing lines (e.g., "word" lines) such that all the transistors in each group of transistors can be activated or turned "on" simultaneously.

Typically, a multiplexer circuit is used to address individual transistors within a group (bank). The number of gate terminals connected to any addressing line is dependent upon the "program" information stored in the ROM memory device. There may be many transistors in a group, or none at all. The total capacitance on any such addressing line (long conductor run) thus depends upon how many transistor gate terminals are connected to it, according to the "program" or bit pattern for the ROM memory device.

It is well known and established that during the fabrication and processing of semiconductor memory devices, particularly ROM (Read Only Memory) memory devices, electrical charges can build up on conductors within the memory devices, particularly during plasma processing, wherein uneven plasmas can induce significant charges on conductive structures such as gate polysilicon (gate poly). The larger is the surface area of a conductor, the greater the charge build-up thereupon. Because long conductors have greater surface area than short conductors, greater amounts of electrical charge tend to build up on long conductors than on short conductors.

The voltage that such charge build-up creates on such conductors depends upon the total amount of capacitance "C" on the conductor. If the total charge on a conductor is "Q", then the voltage on the conductor relative to a reference potential (to which the total capacitance "C" is connected) is given by the well-known relationship (Coulomb's Law) $V=Q/C$, which clearly indicates that the greater the capacitance on a conductor, the lesser the voltage per unit charge that is produced. Accordingly, the more transistor gate terminals which are connected to an addressing line, the lower the voltage will be that is produced per unit of charge build-up on the addressing line. Conversely, the fewer number of transistor gate terminals connected to an addressing line, the higher the voltage will be that is produced per unit of charge build-up on the addressing line.

In fabricating and processing ROM memory devices, if (as is often the case) there are relatively few gate terminals connected to a long conductor (e.g., a word line), then the charge build-up on the long conductor can produce sufficiently high voltage on the long conductor to cause electrical breakdown of thin gate oxide, damaging transistors and rendering the ROM memory device useless. This is commonly known as the "Antenna Effect" in semiconductor processing, whereby long conductors act as "antennae" for electrical charge produced during certain processing steps (e.g., plasma processing), potentially causing damage to the thin gate oxide in transistors connected to the long conductors.

The worst case for the Antenna Effect is where there is only one transistor gate terminal connected to a long conductor. In this case the probability of damage to the single transistor is greatest, since the capacitance on the long conductor is minimal, resulting from the single (only one) gate terminal connection. Any charge built up on the long conductor (which has a relatively large surface area) will produce a significantly greater voltage than in cases where there are multiple gate terminal connections. This (having a relatively few number of operative transistors connected to a line) is to be expected when constructing ROMs. In cases where there are no transistor gate terminals connected to a long conductor, and in cases where there are many transistor gate terminal connections the risk of damage is minimal. When there are many connections, the total capacitance is great enough to limit the voltage produced by charge build-up, and when there are no connections, obviously there are no connected transistors to damage.

Historically, there have been the following two significant approaches for dealing with the Antenna Effect in manufacturing MOS memory devices:

(1) ignore the effect and accept lower yield from the manufacturing process; and (2) provide regularly-spaced openings in the polysilicon lines forming the transistor gate connections. (Between each adjacent pair of openings, there is a corresponding polysilicon line "segment".) The openings limit the length, and consequently the surface area, of any given polysilicon line thereby limiting charge buildup (Q) that can occur on the lines. The openings in the polysilicon lines are bridged in subsequent (i.e., subsequent to plasma processes that induce charge on the lines) processing steps by providing metal jumpers, connected to the polysilicon lines through contact holes (e.g., vias) in overlying insulating layers. Design rules defining the spacing between openings are based upon a worst-case assumption of a single transistor gate connection to a polysilicon line segment.

The first of the two solutions listed above can result in significantly reduced yield, ultimately driving up the cost of the end product (e.g., ROM). In the fiercely competitive semiconductor memory marketplace, this is often not a viable approach.

The second solution is also expensive since the requirement for multiple openings results in an increase in chip area (e.g., a typical set of design rules would require about a 15% increase in ROM chip area to accommodate the jumpers between polysilicon line segments). Furthermore, the spacing between these openings (at the ends of the polysilicon line segments) does not necessarily align with the internal logic structure of the ROM. Therefore, a ROM built of many banks of transistors, each with a specific number of bits and having a corresponding multiplexer, will have an irregular structure. This irregular structure would require a variety of multiplexers with an irregular layout, thereby preventing the use of standardized multiplexer cells, complicating the layout process and tending to frustrate the use of automated layout techniques.

Figure 1:
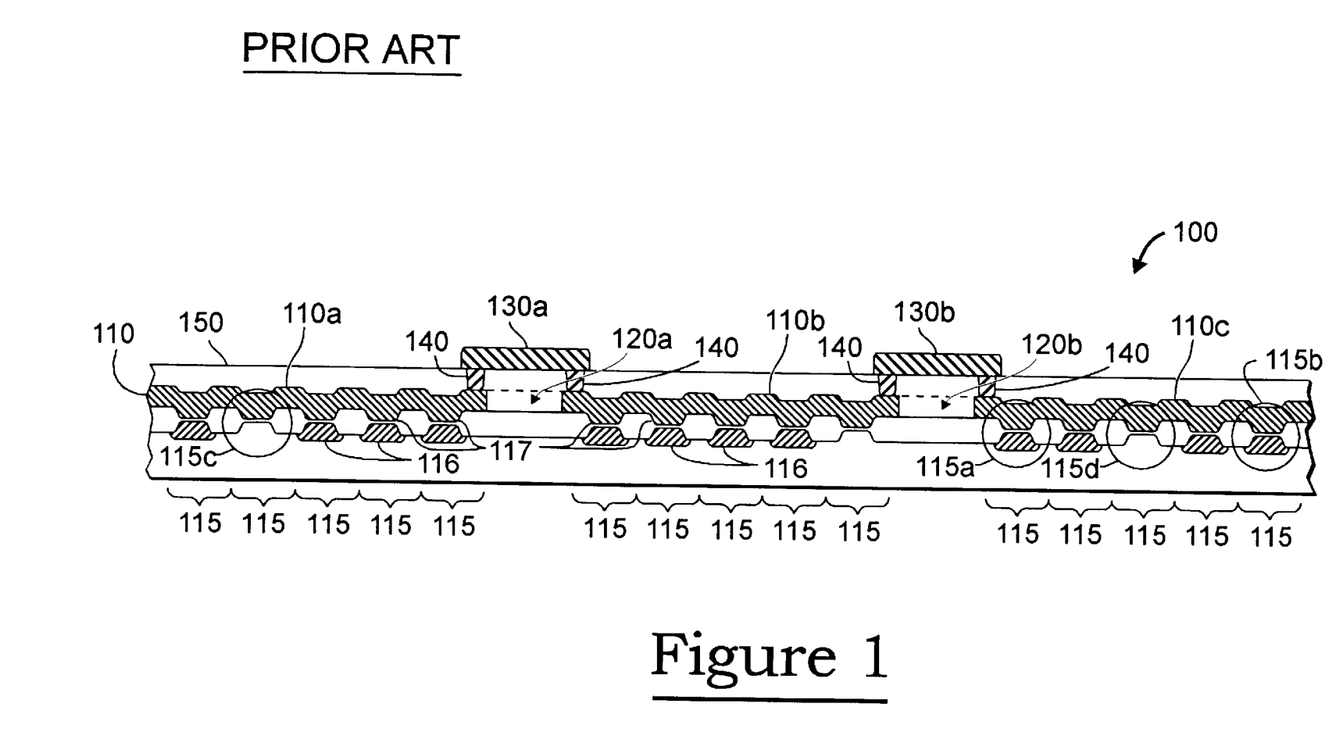
FIG. 1 is cross-sectional view of a portion of a MOS ROM illustrating a prior-art technique for reducing antenna effects.

FIG. 1 is a cross-sectional view of a portion of a MOS ROM device 100 of the prior art which employs the second solution described above. A long polysilicon line 110 is interrupted at positions 120a and 120b along its length, thus breaking it into shorter polysilicon line segments 110a, 110b and 110c. Each polysilicon line segment 110a, 110b and 110c has a number (five shown) of selectively enabled (or not enabled) transistor sites 115 associated with it. The long polysilicon line 110 is used to form gate terminals 117 of the selectively enabled transistors 115. (Note that the channel material 116 of these transistors 115 runs perpendicular to the plane of the drawing. Consequently, individual source and drain regions, and connections thereto, are not illustrated. These would be implemented in a known manner.) In early processing steps, which typically involve plasma processing steps, the short length of the polysilicon line segments 110a, 110b, and 110c limits the amount of charge which collects on any one line segment 110a–110c. In later processing steps, which typically do not involve plasma processing) jumpers 130a and 130b are formed between the polysilicon line segments 110a, 110b and 110c, e.g., by connecting to the polysilicon line segments 110a to 110b, and 110b to 110c, through contact holes 140 in an insulating layer 150 overlying the polysilicon line 110. For the ROM 100, programming is accomplished by selectively forming or omitting channel diffusion (e.g. 116). Exemplary "enabled" transistors (e.g., 115a, 115b) have channel diffusion 116, while "disabled" transistors (e.g., 115c, 115d) do not. As indicated above, transistors which are not enabled will not add to the capacitive load on the polysilicon line 110.

Figure 2:
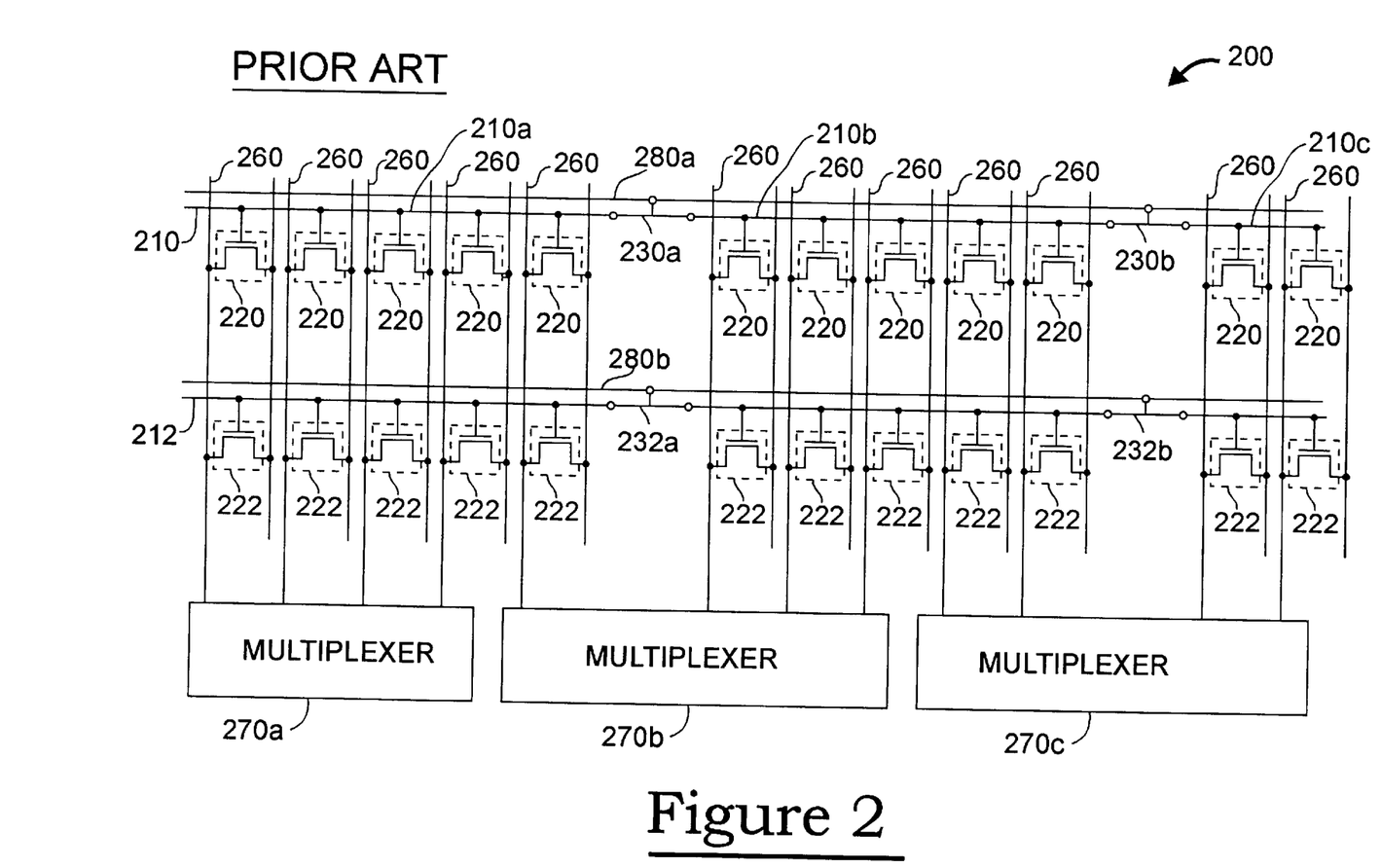
FIG. 2 is a schematic diagram corresponding to the prior-art antenna reduction technique shown in FIG. 1.

FIG. 2 is a schematic diagram 200 corresponding to the antenna effect reduction technique shown in FIG. 1. The schematic diagram 200 further expands the view of circuitry on the MOS ROM device 100 to show two banks of selectively enabled transistors 220 and 222 (compare 115), polysilicon word addressing lines 210 and 212 (compare 110), bit lines 260, and multiplexers 270a, 270b and 270c, for selecting individual transistors (220, 222) in a bank using the bit lines 260. Selectively enabled transistors 220 are interconnected by a long polysilicon line 210, which is broken into a number of polysilicon line segments 210a, 210b, and 210c (compare 110a, 110b, 110c). These polysilicon line segments 210a, 210b and 210c are joined to one another by jumpers 230a and 230b (compare 130a, 130b). As is evident in the schematic 200, the positions of the jumpers 230a and 230b are not "synchronized" to the arrangement of multiplexers 270a–c, yielding varying sizes for the multiplexers. (The multiplexers, although functionally similar, would be of different physical dimension from one another.) Although shown on a schematic diagram, this varying width (across the figure, as viewed) translates to variations in the physical sizes of physical implementations of multiplexers 270a, 270b and 270c. As a result, it is not possible to implement the ROM 100 using fixed-dimension, standard multiplexer cells. Jumpers 232a and 232b, similar to jumpers 230a and 230b are shown in the polysilicon line 212, which is similarly divided into segments. The figure also illustrates metal (e.g., Metal 2) word lines 280a and 280b associated with the two transistor banks.

SUMMARY OF THE INVENTION

It is a general object of the present invention to provide a technique for laying out and fabricating MOS devices having long conductors.

It is another object of the present invention to provide a technique for minimizing the antenna effect in producing MOS memory devices.

It is a further object of the present invention to provide a technique for minimizing the probability of damage to transistors during the processing MOS memory devices.

It is a still further object of the present invention to provide a technique for producing MOS memory devices which minimizes susceptibility to damage due to exposure to charge-producing (e.g., plasma) processes.

It is yet another object of the present invention to provide a technique which accomplishes the foregoing objects without significantly increasing chip area.

One further object of the present invention is to accomplish the foregoing objects in a manner which permits the use of standardized multiplexer cells.

It is a further object of the present invention to accomplish the foregoing objects in a manner which facilitates the use of automated layout techniques.

According to the invention, a MOS ROM device is laid out in parallel rows or "banks" of selectively enabled transistors. A ground supply line and an opening in the conductive line structure are formed at a position in each bank (row) in the ROM layout, at which location a MOS "load" transistor is formed. A long conductive line structure (usually polysilicon, or "gate poly") in each bank forms a common connection between gate terminals of any enabled transistors in the bank. Drain and source terminals for the load transistor are both connected to the ground supply line. A gate terminal of the load transistor is connected to the long conductive line structure for its corresponding row (bank). The load transistor's size is determined based upon the number of gate connections to selectively enabled transistors in the row. The size of the transistor is selected such that its capacitance, when added to the gate capacitances of the selectively enabled transistors in the row, brings the total capacitance on the long conductive line structure up to a predetermined value.

According to a feature of the invention, if there are no selectively enabled transistors in a row (bank), then no load transistor is formed for the row.

According to another feature of the invention, a load transistor is formed for a row (bank) only if the following inequality is satisfied: (A/sum(W*L))>N wherein:

"A" is the area of the long conductive line structure for the row;

"W" is the width of the channel structures for a selectively enabled transistor;

"L" is the length of the channel structures for a selectively enabled transistor;

"W*L" is the gate area for a selectively enabled transistor;

"sum(W*L)" is the total gate area for all selectively enabled transistors in the row; and "N" is a pre-determined maximum permissible ratio of conductive line area to total gate area for each row.

The locations of "load" transistors are pre-determined and independent of ROM programming. The layout of the MOS ROM device is, according to the methodology of the present invention, designed to accommodate the largest load transistor which will be required, according to design rules for the MOS ROM device. The actual size of the load transistor is determined from the bit pattern or "program" for the MOS ROM device according to the number of selectively enabled transistors in a row, as described above.

Since there is only one "load" transistor per row, the logical structure of the MOS ROM device is not disturbed. This means that standardized multiplexer cells can be employed, facilitating the use of automated layout techniques.

By disposing "load" transistors at a rate of only one per row (bank), unnecessary openings in the long conductive line structure are eliminated, thereby minimizing the additional circuit area required to implement the inventive technique.

Further, since the capacitive load on each long conductive line (e.g., gate poly) is brought up to a predetermined level, electrical characteristics of the ROM device can be predicted to a high degree of certainty, and all rows (banks) have similar performance (e.g., speed).

Other objects, features, and advantages of the present invention will become evident in light of the following description thereof.

BRIEF DESCRIPTION OF THE DRAWINGS

Reference is made hereinbelow to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

The adverse, potentially devastating impact of antenna effects, particularly in the context of processing techniques, such as techniques involving plasma processing, imposing a charge on a semiconductor device (particularly MOS devices) has been discussed hereinabove.

Figure 3:
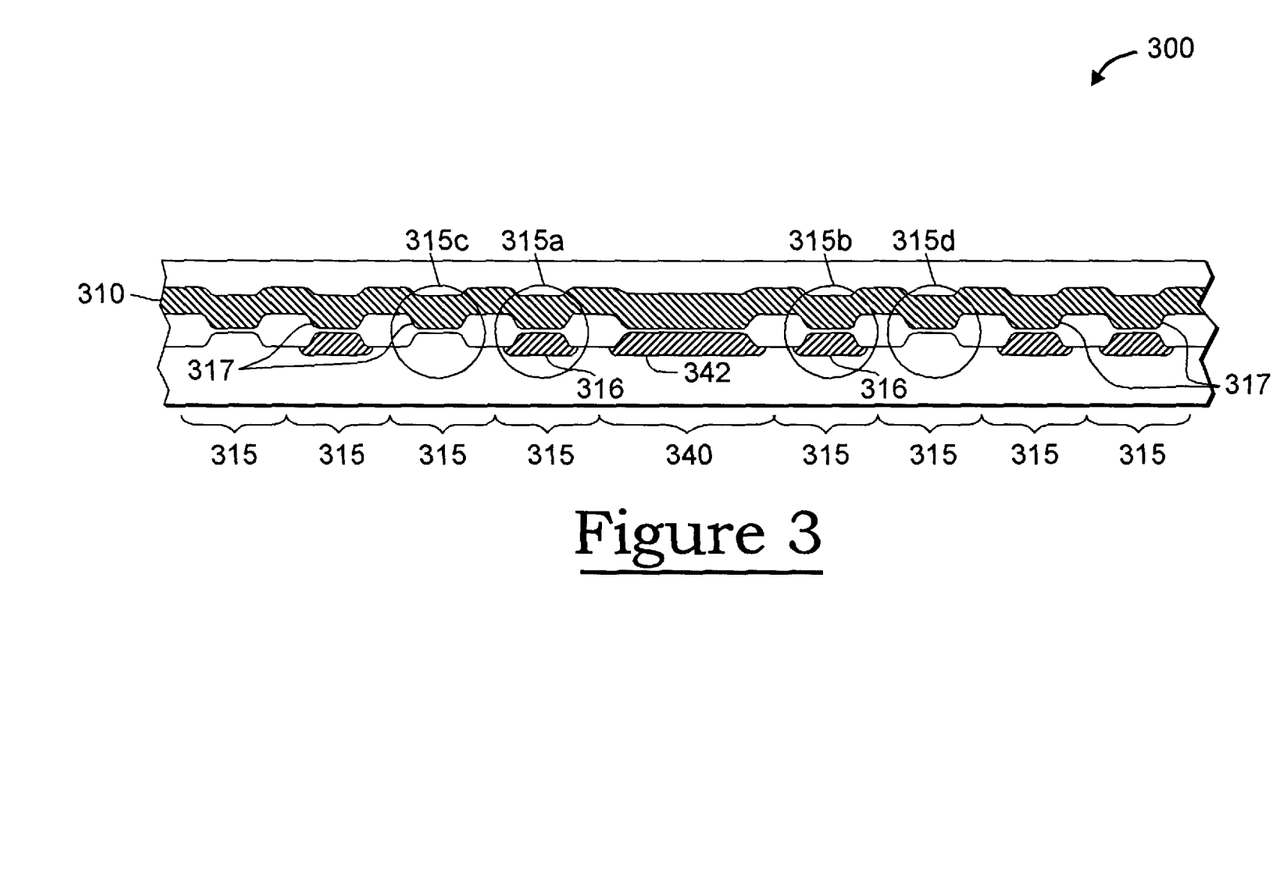
FIG. 3 is a cross-sectional view of a portion of a MOS ROM device illustrating an antenna effect reduction technique, according to the present invention.

FIG. 3 is a cross-sectional view of a portion of a MOS ROM device 300 showing the antenna-effect reduction technique of the present invention. A long polysilicon line 310 has a number of selectively enabled transistor sites 315 forming a "bank" of transistors associated therewith. In the manner of the long polysilicon line 110 described with respect to FIG. 1, the long polysilicon line 310 is used to form gate terminals 317 (compare 117) of the selectively enabled transistors 315. (Note that the channels 316 of these transistors 315 run perpendicular to the plane of the drawing as shown. Consequently, individual source and drain terminals and connections are not shown.) At a given position along the polysilicon line segment 310, aligned with the logical structure of the bank, a "load" transistor 340 is formed. The long polysilicon line 310 forms the gate of the load transistor 340. The load transistor 340 has a channel structure 342 extending into the plane of the page. Source and drain ends (not shown) of the channel structure 340 are commonly connected to a ground supply. For the ROM 300, programming is suitably accomplished by selectively forming or omitting channel diffusion (e.g. 316). "Enabled" transistors (e.g., 315a and 315b) have channel diffusion 316, while "disabled" transistors (e.g., 315c and 315d) do not. As mentioned hereinabove, disabled transistors (i.e., those which are not enabled) do not present a capacitive load to the polysilicon line 310.

Figure 4:
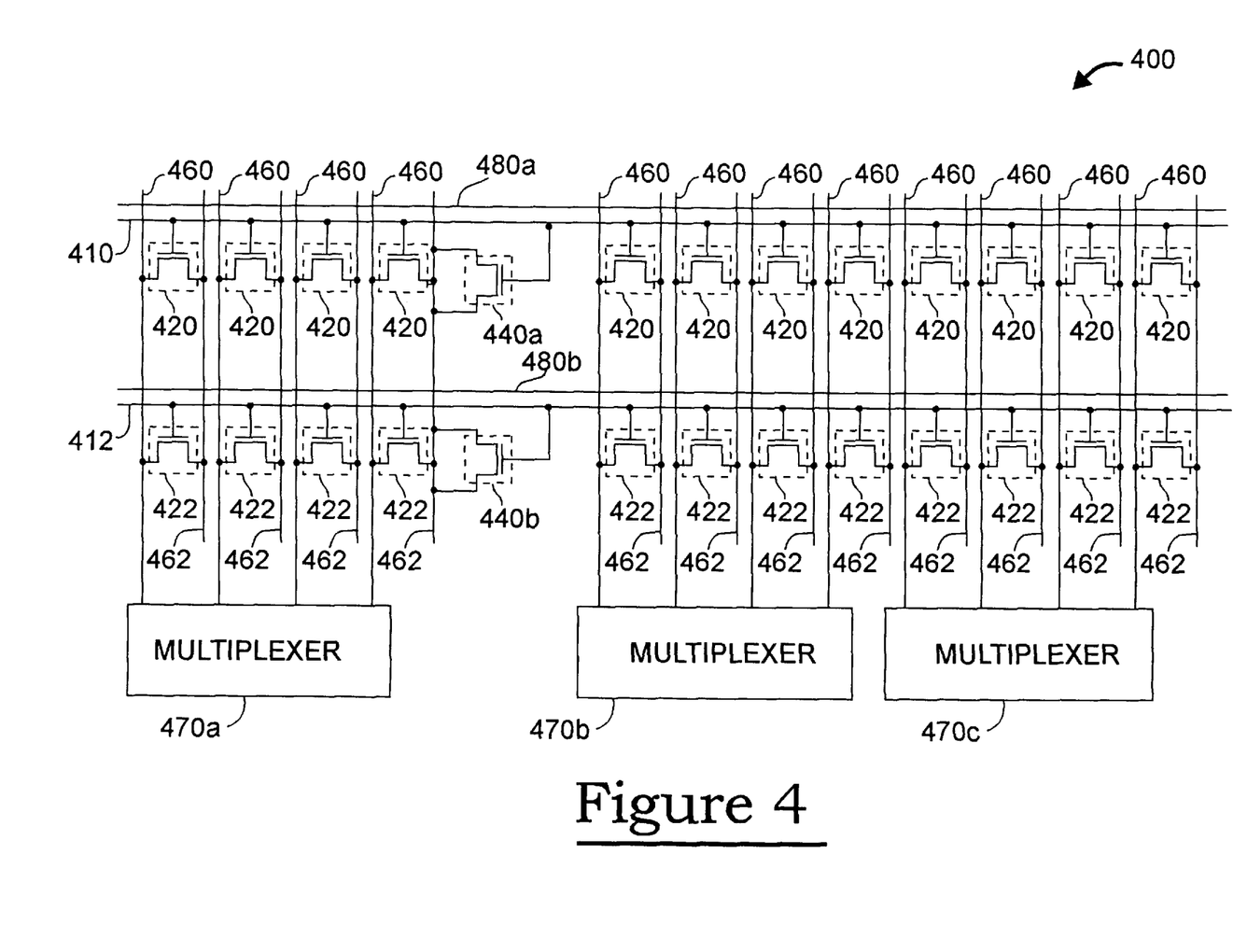
FIG. 4 is a schematic diagram corresponding to the antenna effect reduction technique shown in FIG. 3, according to the present invention.

FIG. 4 is a schematic diagram 400 corresponding to the antenna effect reduction technique shown in FIG. 3, according to the invention. The schematic diagram 400 further expands the view of circuitry on the MOS ROM device 300 to show two banks of selectively enabled transistors 420 and 422 (compare 220 and 222), polysilicon word addressing lines 410 and 412 (compare 210 and 212), bit lines 460 (compare 260), word lines 480a and 480b (compare 280a and 280b), and multiplexers 470a, 470b and 470c (compare 270a–270c), for selecting individual transistors in a bank using the bit lines 460. Each transistor has its source terminal connected to a ground line 462 and its drain terminal connected to a bit line 460. Load transistors 440a and 440b (compare 340), disposed at a selected position along each bank, have their gate terminals connected to respective polysilicon word addressing lines 410 and 412. Source and drain terminals of the load transistors 440a and 440b are commonly connected to a one of the ground lines 462, as shown.

The size of the load transistors (440a, 440b) is determined according to the number of selectively enabled transistors connected to a long conductive line (polysilicon word line 410 and 412, respectively). (As mentioned above, transistors which are "disabled," i.e., either absent or disconnected, do not place a capacitive load on the long conductive line (word line)).

Preferably, if there are no "enabled" transistors in a row (bank), then no load transistor is formed (enabled) for the row.

Further, an aspect of the present inventive technique provides that a load transistor is formed (enabled) for a row (bank) only if the following inequality is satisfied:

$$(A/\text{sum}(W*L)) > N$$

wherein:
- "A" is the area of the long conductive line structure for the row;
- "W" is the width of the channel structures for a selectively enabled transistor;
- "L" is the length of the channel structures for a selectively enabled transistor;
- "W*L" is the gate area for a selectively enabled transistor;
- "sum(W*L)" is the total gate area for all selectively enabled transistors in the row; and
- "N" is a pre-determined maximum permissible ratio of conductive line area to total gate area for each row.

A load transistor is formed (enabled) for a row only if the inequality is true, otherwise it is not necessary. By way of example, for a long polysilicon line having an area of A=210 $\mu m^2$, and for antenna rules permitting a maximum line area to gate area ratio of N=30, a minimum sum(W*L)=7 $\mu m^2$ is required to make the inequality false. If the selectively enabled transistors used for the array have gate areas of 2 $\mu m^2$ and only one transistor is "enabled" for the polysilicon line, then a "load" transistor having a gate area of 5 $\mu m^2$ is required to complete the target capacitive load on the long polysilicon line. If there are no transistors on the line or the total gate area for "enabled" transistors exceeds 7 $\mu m^2$, then it is not necessary to form (enable) a "load" transistor for the long polysilicon line. If, for example, programming for a ROM is accomplished by customizing diffusion (i.e., selectively creating or omitting transistor channels), then the selection between a cell which includes a transistor and a cell that does not include a transistor is completely accomplished by altering one processing step. The capacitive load of the load transistor can be controlled by controlling the size of the gate region thereof which, in turn, can be set by controlling the area of channel diffusion under the polysilicon gate terminal thereof (part of the long polysilicon line).

With the above-described use of "load" transistors, it is not necessary to segment a long polysilicon line (e.g. 110) and to provide jumpers (e.g. 130a and 130b) to connect the segments.

As described hereinabove, the locations of "load" transistors are pre-determined and independent of programming, and the layout of the MOS ROM device is designed to accommodate the largest load transistor which will be required. Even using the largest load transistor, however, the actual additional chip area required to provide for "load" transistors of the type described hereinabove is extremely small compared to total chip are, especially as contrasted to the use of jumpers in the prior art.

The present inventive technique saves considerable chip area in comparison to the prior art technique of creating multiple regular openings in long polysilicon lines. For a typical set of design rules for a MOS ROM, the savings is about 15% of chip area.

By minimizing the impact of the antenna effect, overall process yields are improved, thereby reducing component cost and increasing component production rate.

Because of the "synchronization" which can be achieved using the methodology of the present invention, i.e., the locating of load transistors between multiplexers, including the location of "load" transistors with respect to the logical structure of the MOS memory device in the present inventive technique, a "modular" structure of the ROM is preserved even when design rules change. This facilitates the use of standardized circuit cells (e.g., multiplexers), The present inventive technique yields ROM word lines having controlled load capacitances and, therefore, the electrical behavior of the ROM (i.e., its reaction to plasma processes) is better known and controlled.

Application of the present inventive technique is particularly advantageous in the manufacture of ROM devices, and in the manufacture of any integrated circuit which incorporates a ROM function.

Although the invention has been illustrated and described in detail in the drawings and in the foregoing description, the same is to be considered as illustrative and not restrictive in character—it being understood that only preferred embodiments have been shown and described, and that all changes and modifications that come within the spirit of the invention are desired to be protected.

What is claimed is:

1. A method of reducing gate oxide damage in producing read-only-memory arrays, comprising:

providing a read-only-memory array, said array including a bank of MOS transistor sites corresponding, respectively, to one bit of storage in the read-only-memory array;

selectively enabling a first number of MOS transistors in said MOS transistor sites having respective gate terminals, each of such gate terminals providing access to a corresponding gate region having dimensions defining a first are, the first area characterized by a first value indicative of a size of the first area;

providing a long conductive line having dimensions defining a second area, the second area characterized by a second value indicative of a size of the second area;

connecting said long conductive line to said gate terminals;

providing a load transistor site at a selected position along said long conductive line for a load transistor having a gate terminal, said load transistor gate terminal providing access to a gate region of the load transistor, said gate region of the load transistor having dimensions defining a third area, the third area characterized by a third value indicative of a size of the third area;

calculating a mathematical relationship between the second value, indicative of the second area, of the conductive line, and the first value, indicative of the first area, for selectively enabled transistors deciding whether to enable said load transistor at said load transistor site in response to the calculated mathematical relationship;

enabling said load transistor at said load transistor site only if it is decided in said deciding step to enable said load transistor; and connecting said load transistor gate terminal to said long conductive line.

2. A method according to claim 1, wherein said step of enabling said first number of MOS transistors includes controlling diffusion of a channel material in a channel area of said MOS transistors.

3. A method according to claim 1, wherein said step of enabling said load transistor includes controlling diffusion of a channel material in a channel area of said load transistor.

4. A method according to claim 1, further comprising:
connecting a source terminal of each of said first number of MOS transistors to a ground supply.

5. A method according to claim 4, further comprising:
connecting a drain terminal and a source terminal of said load transistor to a ground supply.

6. A method according to claim 5, further comprising:
calculating the third value, indicative of the size of the third area, according to the first number of MOS transistors.

7. A method according to claim 5, further comprising:
calculating the third value, indicative of the size of the third areas according to a total capacitive load on said long conductive line, said capacitive load being substantially proportional to the first number.

8. A method according to claim 1, wherein:
in said deciding step, it is decided to enable said load transistor in response to said calculated mathematical relationship if the first number is at least one.

9. A method according to claim 1, wherein:
in said deciding step, it is decided to enable said load transistor in response to said calculated mathematical relationship if the first number is less than a predetermined value.

10. A method according to claim 1, wherein:
in said deciding step, it is decided to enable said load transistor in response to said calculated mathematical relationship if the first number is at least one and the first number is less than a predetermined value.

11. A method according to claim 1, wherein:
in said deciding step, it is decided not to enable said load transistor in response to said calculated mathematical relationship if said first number is zero.

12. A method of reducing gate oxide damage in producing read-only-memory arrays, comprising:
providing a read-only-memory array, said array including banks of MOS transistor sites, each such bank including a set of MOS transistor sites, each such MOS transistor site corresponding to one bit of storage in the read-only memory array;
for each bank, selectively enabling a number of MOS transistors in said MOS transistor sites in the bank, each selectively enabled transistor having a gate terminal providing access to a corresponding gate region having dimensions defining a first area, the first area characterized by a first value indicative of a size of the first area;
providing a long conductive line for each bank having dimensions defining a second area, the second area characterized by a second value indicative of a size of the second area;
connecting the long conductive line for each bank to the gate terminals of the enabled MOS transistors in the bank;
providing an associated load transistor site at a selected position along each long conductive line for a load transistor having an associated gate terminal, said load transistor gate terminal providing access to a gate region of the load transistor with which it is associated, each gate region of each load transistor having dimensions defining a third area, the third area characterized by a third value indicative of a size of the third area;
for each bank, calculating a mathematical relationship between the second value, indicative of the second area of the conductive line, and the first value, indicative of the first area, for selectively enabled transistors;
deciding whether to enable said load transistor at each load transistor site in response to the calculated mathematical relationship;
enabling said load transistor at said each load transistor site only if it is decided in said deciding step to enable said each load transistor; and
connecting said load transistor gate terminal to said long conductive line with which its associated load transistor's site is associated.

13. A method according to claim 12 wherein said step of enabling said number of enabled MOS transistors in each bank includes controlling diffusion of a channel material in a channel area of said MOS transistors.

14. A method according to claim 12, wherein said step of enabling said load transistors includes controlling diffusion of a channel material in a channel area of said load transistors.

15. A method according to claim 12, further comprising:
connecting a source terminal of each of said first number of MOS transistors to a ground supply.

16. A method according to claim 15, further comprising:
connecting a drain terminal and a source terminal of each load transistor to a ground supply.

17. A method according to claim 16, further comprising:
calculating the third value, indicative of the size of the third area of the gate region of each load transistor, according to the number of enabled MOS transistors connected to the long conductive line with which the site of said load transistor is associated.

18. A method according to claim 16, further comprising:
calculating the third value, indicative of the size of the third area of the gate region of each load transistor, according to a total capacitive load on the long conductive line with which the site of said load transistor is associated, each such capacitive load being substantially proportional to the number of enabled transistors connected to each long conductive line.

19. A method according to claim 12, wherein:
in said deciding step, it is decided whether to enable said load transistor based on said calculated mathematical relationship at a load transistor site associated with a long conductive line if the number of enabled transistors having gate terminals connected to the long conductive line is at least one.

20. A method according to claim 12, wherein:
in said deciding step, it is decided whether to enable said load transistor based on said calculated mathematical relationship at a load transistor site associated with a long conductive line if the number of enabled transistors having gate terminals connected to the long conductive line is less than a pre-determined value.

21. A method according to claim 12, wherein:
in said deciding step, it is decided whether to enable said load transistor based on said calculated mathematical relationship at a load transistor site associated with a long conductive line if the number of enabled transistors with gate terminals connected to the long conductive line is at least one and less than a pre-determined value.

22. A method according to claim 1, further comprising:
connecting a drain terminal and a source terminal of said load transistor to a ground supply.

23. A method according to claim 1, further comprising:
calculating the third value, indicative of the third area, according to the first number of MOS transistors.

24. A method according to claim 1, wherein said step of calculating said mathematical relationship includes calculating a ratio between said second value and the sum of said first values indicative of the first areas for said selectively enabled transistors.

25. A method according to claim 12, further comprising:

calculating the third value, indicative of the third area of the gate region of each load transistor, according to the number of enabled MOS transistors connected to the long conductive line with which the site of said load transistor is associated.

26. A method according to claim 12, further comprising:

calculating the third value, indicative of the third area of the gate region of each load transistor, according to a total capacitive load on the long conductive line with which the site of said load transistor is associated, each such capacitive load being substantially proportional to the number of enabled transistors connected to each long conductive line.

27. A method according to claim 12, wherein said step of calculating the mathematical relationship includes calculating a ratio between said second value, indicative of the second area, and the sum of said first values, indicative of the first areas for said selectively enabled transistors.

28. The method of claim 1, wherein:

the mathematical relationship calculated in the calculating step is $$(A/\mathrm{sum}(W*L)) > N,$$

where

"A" is the second value;

"W*L" is the first value;

"sum(W*L)" is the total of first values for the first number of selectively enabled MOS transistors; and "N" is a pre-determined maximum permissible ratio of second value to total of first values.

29. The method of claim 12, wherein:

the mathematical relationship calculated in the calculating step is $$(A/\mathrm{sum}(W*L)) > N,$$

where

"A" is the second value;

"W*L" is the first value;

"sum(W*L)" is the total of first values for the first number of selectively enabled MOS transistors; and "N" is a pre-determined maximum permissible ratio of second value to total of first values.

* * * * *

UNITED STATES PATENT AND TRADEMARK OFFICE
CERTIFICATE OF CORRECTION

PATENT NO.: 5,852,317
DATED: December 22, 1998
INVENTOR(S): RINA BERMAN

It is certified that errors appear in the above-identified patent and that said Letters Patent is hereby corrected as shown below:

In Col. 8, line 34, delete "are" and replace with --area--.

In Col. 8, line 52, after "transistors" insert --;--.

In Col. 9, line 13, delete "areas" and replace with --area,--.

Signed and Sealed this

Twenty-third Day of March, 1999

Attest:

Q. TODD DICKINSON

Attesting Officer     Acting Commissioner of Patents and Trademarks